(12) United States Patent
Fossum et al.

(10) Patent No.: US 10,349,015 B2
(45) Date of Patent: Jul. 9, 2019

(54) IMAGE SENSOR COLOR FILTER ARRAY PATTERN

(71) Applicant: TRUSTEES OF DARTMOUTH COLLEGE, Hanover, NH (US)

(72) Inventors: Eric R. Fossum, Wolfeboro, NH (US); Leo Anzagira, Hanover, NH (US)

(73) Assignee: TRUSTEES OF DARTMOUTH COLLEGE, Hanover, NH (US)

( * ) Notice: Subject to any disclaimer, the term of this patent is extended or adjusted under 35 U.S.C. 154(b) by 0 days.

(21) Appl. No.: 15/580,808

(22) PCT Filed: Dec. 1, 2015

(86) PCT No.: PCT/US2015/063287
§ 371 (c)(1),
(2) Date: Dec. 8, 2017

(87) PCT Pub. No.: WO2016/200430
PCT Pub. Date: Dec. 15, 2016

(65) Prior Publication Data
US 2018/0227550 A1    Aug. 9, 2018

Related U.S. Application Data

(60) Provisional application No. 62/172,805, filed on Jun. 8, 2015.

(51) Int. Cl.
*H04N 9/04* (2006.01)
*H04N 5/378* (2011.01)
(Continued)

(52) U.S. Cl.
CPC ....... *H04N 9/045* (2013.01); *H01L 27/14621* (2013.01); *H01L 27/14623* (2013.01);
(Continued)

(58) Field of Classification Search
CPC ...... H04N 9/045; H04N 5/3745; H04N 5/378; H04N 5/3458; H04N 9/04; H01L 27/14621; H01L 27/14623; H01L 27/14627

See application file for complete search history.

(56) References Cited

U.S. PATENT DOCUMENTS

| 4,834,508 A | 5/1989 | Fergason |
| 4,951,130 A * | 8/1990 | Iizuka ............... H01L 31/02162 257/E31.121 |

(Continued)

OTHER PUBLICATIONS

Fossum, E., Quanta Image Sensor, Mar. 22, 2012, [retrieved online on Jan. 19, 2016]. URL:http://ericfossum.com/Presentations/2012% 20March%20QIS%20London.pdf; pp. 1-12, 19, 35.
(Continued)

*Primary Examiner* — Luong T Nguyen
(74) *Attorney, Agent, or Firm* — David V. Rossi; Haug Partners LLP

(57) ABSTRACT

Some embodiments provide an image sensor color filter array pattern that mitigates and/or minimizes the impact of optical and carrier crosstalk on color reproduction accuracy and/or signal-to-noise, the color filter array comprising a plurality of kernels, wherein each kernel has an identical configuration of color filter elements comprising primary color filter elements corresponding to at least three respective different primary colors, and a plurality of secondary color filter elements. A respective one of the secondary color filter elements is disposed as a nearest neighbor to and between every pair of primary color filter elements of different colors in the kernel, with the respective secondary color filter element representing a secondary color that is a combination of the different colors of the primary color filter elements that are nearest neighbors to the respective secondary color filter element.

19 Claims, 4 Drawing Sheets

| R | Y | G 9 | Y | R |
|---|---|---|---|---|
| Y | G 7 | C | G 7 | Y |
| G 9 | C | B | C | G 9 |
| Y | G 7 | C | G 7 | Y |
| R | Y | G 9 | Y | R |

(51) Int. Cl.
*H01L 27/146* (2006.01)
*H04N 5/3745* (2011.01)

(52) U.S. Cl.
CPC ....... *H01L 27/14627* (2013.01); *H04N 5/378* (2013.01); *H04N 5/3745* (2013.01); *H04N 9/04* (2013.01)

(56) References Cited

U.S. PATENT DOCUMENTS

| | | | |
|---|---|---|---|
| 8,345,132 B2 * | 1/2013 | Tai | H01L 27/14621 348/222.1 |
| 8,934,034 B2 * | 1/2015 | Nayar | H01L 27/14621 348/277 |
| 9,479,745 B2 * | 10/2016 | Lu | H04N 5/357 |
| 2009/0200451 A1 | 8/2009 | Conners | |
| 2009/0230394 A1 * | 9/2009 | Nagaraja | H01L 27/14621 257/59 |
| 2009/0321617 A1 * | 12/2009 | Kim | G02B 5/201 250/226 |
| 2010/0104178 A1 | 4/2010 | Tamburrino et al. | |
| 2010/0108866 A1 | 5/2010 | Tseng et al. | |
| 2012/0327277 A1 | 12/2012 | Myhrvold | |
| 2013/0083223 A1 | 4/2013 | Tai et al. | |
| 2013/0308022 A1 | 11/2013 | Tanaka | |
| 2014/0313387 A1 | 10/2014 | Vogelsang et al. | |
| 2015/0070562 A1 | 3/2015 | Nayar et al. | |

OTHER PUBLICATIONS

International Search Report and Written Opinion issued (dated Feb. 9, 2016) in corresponding International Application No. PCT/US2015/063287. (10 pages total.).

\* cited by examiner

| R | G | R | G | R |
|---|---|---|---|---|
| G | B | G | B | G |
| R | G | R | G | R |
| G | B | G | B | G |
| R | G | R | G | R |

FIG. 1　　(Prior Art)

| C | M | C | M | C |
|---|---|---|---|---|
| Y | G | Y | G | Y |
| C | M | C | M | C |
| Y | G | Y | G | Y |
| C | M | C | M | C |

FIG. 2　　(Prior Art)

|   |   |   |   |   |
|---|---|---|---|---|
| R | Y | G | Y 9 | R |
| Y | G 7 | C | G 7 | Y |
| G 9 | C | B | C | G 9 |
| Y | G 7 | C | G 7 | Y |
| R | Y | G 9 | Y | R |

FIG. 3

|   |   |   |   |   |
|---|---|---|---|---|
| R | Y | G 9 | Y | R |
| Y | W 7 | C | W 7 | Y |
| G 9 | C | B | C | G 9 |
| Y | W 7 | C | W 7 | Y |
| R | Y | G 9 | Y | R |

FIG. 4

IMAGE SENSOR COLOR FILTER ARRAY PATTERN

RELATED APPLICATIONS

This application is filed pursuant to 35 U.S.C. § 371 based on International Application No. PCT/US2015/063287, filed Dec. 1, 2015, which claims the benefit of U.S. Provisional Application No. 62/172,805, filed Jun. 8, 2015, which is hereby incorporated herein by reference in its entirety.

BACKGROUND

The present disclosure relates generally to apparatus and methods for image sensing, and, more particularly, to a color filter array for an image sensor, and to an image sensor comprising the color filter array, the color filter array having a pattern well-suited for mitigating the effects of cross-talk.

In the world of image sensors, increasing pixel count while decreasing pixel size has been an important trend that has seen pixel pitch reduced to 1 µm and below and pixel count increase to over 40 million pixels. This drive to decrease pixel size poses a number of significant challenges. A fundamental challenge is the reduction in light collection that has been mitigated by a variety of approaches including the use of microlenses and backside illumination (BSI).

Another problem that remains persistent in small pixels is the increased occurrence of cross talk. Cross talk may occur in two different ways. First, light incident above one pixel may penetrate into a neighboring pixel and generate photocharge. For example, a photon incident at some off-vertical (e.g., obtuse) angle may pass through a color filter (a red photon going through a red filter) overlying a first pixel, but due to the angle the red photon crosses over into and is absorbed by a neighboring pixel instead. Since that pixel might be covered by a green filter, the red photon erroneously contributes to the green signal. This is known as optical cross talk and tends to be very important in frontside illuminated (FSI) pixels. As pixel sizes decrease to levels comparable to the wavelength of the visible light, increased diffraction increases this form of cross talk in both FSI and BSI pixels.

In the second cross-talk mechanism, the charge generated in a pixel diffuses into neighboring pixels and contributes to the wrong signal. This is known as electrical or diffusion cross talk. Decreasing pixel sizes shortens the length over which the charge has to diffuse to reach neighboring pixels, aggravating the impact.

Cross talk in color image sensor pixels diminishes the color signal of affected color channels and increases the overlap in the spectral responses of the different color channels. For instance, in the Bayer pattern, the cross talk in the red pixel extends its spectral response into the green wavelength region and decreases the response in the red spectral region. The diminished color signal as a result of cross talk reduces the color gamut that can be reproduced from the raw color signal without color correction.

Typically, the standard sRGB color gamut can be reproduced by means of color correction. If, however, the cross talk substantially diminishes the color gamut of the device, more intensive color correction is required. The color correction must perform an amplification operation to transform the reduced gamut, and increased signal subtraction is required to compensate for the increased overlap in spectral responses. Increased cross talk therefore increases the noise amplification of the color correction process and leads to reduced signal-to-noise ratio (SNR) performance. Color correction matrices for sensors with increased cross talk will therefore sacrifice either color reproduction accuracy or SNR, or both.

Several approaches have been suggested both for reducing the effects of cross talk and for mitigating its impact on SNR and color reproduction accuracy. Most approaches have been centered on the idea of modifying the pixel structure to minimize cross-pixel light absorption. For instance, M. Furumiya et al., "High sensitivity and no-cross-talk pixel technology for embedded CMOS image sensor," IEEE Trans. Electron Devices 48, 2221-2227 (2001), employs a double light shield to suppress cross talk caused by obliquely incident light. And US Patent Application Publication No. 2012/0025199 to S.-Y. Chen et al. uses deep trench isolation to reduce electrical cross talk between pixels. More recently, Samsung's ISOCELL pixel technology has targeted cross-talk reduction by introducing an insulating layer between pixels to prevent electrical cross talk and lower cross talk occurrence by a reported 30%. See, e.g., Samsung Tomorrow, "Samsung launches ISOCELL: Innovative image sensor technology for premium mobile devices," http://global.samsungtomorrow.com/?p=28442.

Other approaches modify the color filter array design specifically to mitigate the occurrence and effect of cross talk. See, e.g., U.S. Pat. No. 8,054,352 to J. Kim and H. Tanaka; and US Patent Application Publication No. 2012/0019695 to Y. Qian et al. More specifically, for example, in the approach described in U.S. Pat. No. 8,054,352, the cross-talk behavior of the pixel is first characterized, and then a transformation is determined to map the spectral response in the presence of cross talk to the desired spectral response. This transformation is implemented as an adjustment in the composition of pigments in the color filters.

SUMMARY OF SOME EMBODIMENTS

Some embodiments of the present disclosure provide an image sensor color filter array (CFA) pattern that mitigates the effect of cross talk by including a respective secondary color filter element disposed as a nearest neighbor to and between every pair of primary color filter elements of different colors in the CFA pattern, with the respective secondary color filter element representing a secondary color that is a combination (e.g., summation) of the different colors of the primary color filter elements that are nearest neighbors to the respective secondary color filter element. In some embodiments, the secondary color filter element is provided as a continuous material having color filter characteristics of the secondary color. In some embodiments, the secondary color filter element is provided as two color filter portions having respective primary color filter characteristics of the nearest neighbor primary color filter elements. Some image sensor CFA pattern embodiments of the present disclosure are particularly well suited for small pixels, such as sub-diffraction limit pixels, and mitigate the effects of cross talk on the color reproduction accuracy and/or SNR performance in image sensors where high cross talk cannot be avoided. Some CFA pattern embodiments provide markedly better color reproduction than the CFAs widely used in industry today.

Some embodiments of the present disclosure provide an image sensor CFA having a CFA kernel that comprises color filter elements including (i) primary color filter elements corresponding to at least three respective different primary colors, each of the primary color filter elements configured to selectively transmit photons corresponding to the primary color to which the primary color filter element corresponds;

and (ii) secondary color filter elements. Each nearest neighbor of each one of the primary color filter elements in the kernel is a given one of the secondary color filter elements that is disposed between the one primary color filter element and another of the primary color filter elements that (i) is a nearest neighbor to the given one of the secondary color filter elements and (ii) has a primary color different from the primary color of the one of the primary color filter elements. And the given one of the secondary color filter elements has a secondary color corresponding to a combination (e.g., summation) of the primary colors of the one primary color filter element and the another primary color filter element between which the given one of the secondary color filter elements is disposed as a nearest neighbor.

In addition, the CFA kernel may include a further color filter element that is a nearest neighbor only to the secondary color filter elements. For example, such a further color filter element may be disposed as a next-nearest-neighbor to four of the primary color filter elements in the kernel.

In some embodiments, the further color filter element may have a primary color that is the same as the primary color of another primary color element in the kernel that is surrounded by nearest neighbor secondary color elements having the same set of colors as the secondary color filter elements array that are nearest neighbors to the further color filter element. In some embodiments, the further color filter element may have a light transmission characteristic corresponding to a combination (e.g., summation) of the colors of each primary color filter element that is a next-nearest neighbor to the further color filter element. For instance, the further color filter element may be white if its next-nearest neighbor color filter elements are red, green, green, and blue.

In some embodiments, the CFA filter elements may be arranged as a regular rectangular (e.g., square) array, with the elements arranged in a row/column configuration. For example, some embodiments of an image sensor CFA pattern having a rectangular array of color filter elements are based on a conventional Bayer pattern CFA design by incorporating a secondary color filter element between and adjacent to every two primary color filter elements in the kernel in the horizontal and vertical directions. The secondary color represented by each secondary color element placed between and adjacent to two primary color filter elements is the secondary color obtained by summing the two primary colors of the two primary color filter elements (i.e., Yellow between Red and Green, and Cyan between Blue and Green). This CFA pattern ensures that crosstalk from the two primary color pixels contributes directly to the corresponding secondary color pixel. In some embodiments of such a modified Bayer CFA, color filter elements between primary color elements in the diagonal direction (and between and adjacent to secondary color elements in the vertical and horizontal directions) may be white and/or green.

As noted, in some embodiments of CFA patterns according to the present disclosure, the secondary color filter element is provided as a continuous material having color filter characteristics of the secondary color. In some embodiments, the secondary color filter element is provided as two color filter portions having respective primary color filter characteristics of the nearest neighbor primary color filter elements.

Some embodiments of the present disclosure are directed to an image sensor comprising (i) an array of pixels, each pixel having a photosensor, and (ii) a CFA overlying (but not necessarily in direct contact with) the array of pixels and having primary and secondary color filter elements according to the present disclosure. In some embodiments, each of the primary and secondary color filter elements of the CFA overlies a respective individual pixel of the image sensor. In some embodiments, each of the primary and secondary color filter elements in the CFA may overlie a plurality of individual pixels of the image sensor. For example, each color filter element in the array may be configured as the color filter element for an m×n sub-array of pixels, where m and n are positive integers, at least one of which is greater than one (e.g., the sub-arrays may be 1×2, 2×2, 2×4, 4×4, 8×8, etc.).

By way of non-limiting example, the image sensor may be a conventional CMOS image sensor (e.g., configured to operate in charge integration mode, with a single integration period per pixel per frame), a digital integration sensor (DIS), a quantized DIS (qDIS), or a Quanta Image Sensor (QIS). In some embodiments, the pixels may be sub-diffraction limit pixels, which in some implementations may be jots. The image sensor may include an array of microlens elements, and each color filter element of the CFA may have a respective overlying microlens element.

It will be appreciated by those skilled in the art that the foregoing brief description and the following description with respect to the drawings are illustrative and explanatory of some embodiments of the present invention, and are neither representative nor inclusive of all subject matter and embodiments within the scope of the present invention, nor intended to be restrictive or characterizing of the present invention or limiting of the advantages which can be achieved by embodiments of the present invention, nor intended to require that the present invention necessarily provide one or more of the advantages described herein with respect to some embodiments. Thus, the accompanying drawings, referred to herein and constituting a part hereof, illustrate some embodiments of the invention, and, together with the detailed description, serve to explain principles of some embodiments of the invention.

BRIEF DESCRIPTION OF THE DRAWINGS

Aspects, features, and advantages of embodiments of the invention, both as to structure and operation, will be understood and will become more readily apparent when the invention is considered in the light of the following description made in conjunction with the accompanying drawings, in which like reference numerals designate the same or similar parts throughout the various figures, and wherein:

FIG. 1 depicts a top plan view of a portion of a conventional Bayer color filter array pattern;

FIG. 2 depicts a top plan view of a portion of a conventional CMY color filter array pattern;

FIG. 3 depicts a top plan view of a portion of an illustrative color filter array pattern based on a Bayer pattern, in accordance with some embodiments of the present invention;

FIG. 4 depicts a top plan view of a portion of an illustrative color filter array pattern based on a Bayer pattern, in accordance with some embodiments of the present invention;

DETAILED DESCRIPTION OF SOME EMBODIMENTS

Figures 5, 6:
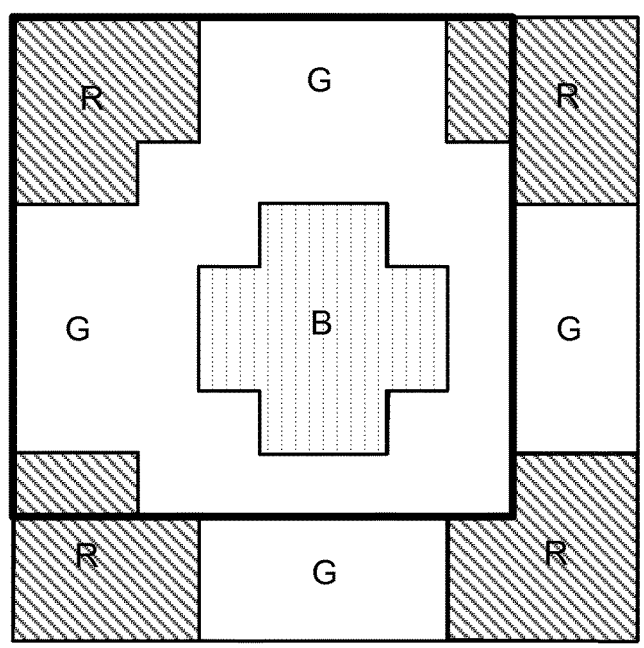
FIG. 5 depicts an illustrative alternative implementation of the color filter array pattern of FIG. 3, in accordance with some embodiments of the present invention.
FIG. 6 depicts an illustrative embodiment corresponding to the color filter array of FIG. 5 transformed such that adjacent color filter elements having the same color are implemented as a continuous color filter region, in accordance with some embodiments of the present invention.

Throughout the description and claims, the following terms take at least the meanings explicitly associated herein, unless the context dictates otherwise. The meanings identified below do not necessarily limit the terms, but merely provide illustrative examples for the terms.

The phrase "an embodiment" as used herein does not necessarily refer to the same embodiment, though it may. Similarly, the phrase "some embodiments" as used herein at different instances does not necessarily refer to the same "some embodiments," though it may. In addition, the meaning of "a," "an," and "the" include plural references; thus, for example, "an embodiment" is not limited to a single embodiment but refers to one or more embodiments. Similarly, the phrase "one embodiment" does not necessarily refer the same embodiment and is not limited to a single embodiment. As used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise.

The terms "color filter," "color filter element," or similar terms, as used herein in accordance with their ordinary and customary meaning to those skilled in the art, may be understood to refer to, for example, a component (e.g., a material layer) that selectively transmits light within a certain range of wavelengths (e.g., corresponding to a portion of the color spectrum), the color filter thus having a wavelength-dependent transmission characteristic such that it transmits light within the certain range of wavelengths (sometimes referred to as the "passband"), while substantially absorbing (and/or reflecting) light having wavelengths (or color) outside of the passband.

As used herein, two color filter elements are "adjacent" or "neighboring" if they are disposed near each other without any intervening color filter element; thus, "adjacent" or "neighboring" color filter elements may share a border and/or share a corner or point (though they may not necessarily contact each other at the border and/or point). In addition, as used herein, the term "nearest neighbor" with respect to any given color filter element in a color filter array refers to an adjacent color filter having a minimum distance to the given color filter element as may be measured along a line between corresponding points on the adjacent and given color filter elements, in accordance with the ordinary and customary meaning of "nearest neighbor" in the context of arrays, as understood by those skilled in the art. Similarly, the term "next-nearest-neighbor" with respect to any given color filter element in a color filter array refers to an adjacent color filter having the next-shortest distance (greater than the minimum distance) to the given color filter element as may be measured along a line between corresponding points on the adjacent and given color filter elements, in accordance with the ordinary and customary meaning of "next-nearest-neighbor" in the context of arrays, as understood by those skilled in the art. It may be understood, for example, that a given color filter element may have more than one nearest neighbor as well as more than one next-nearest-neighbor.

Further, it will be understood that for ease of reference and clarity of exposition with respect to a regular, rectangular (e.g., square) array, having elements arranged in a row/column configuration, the terms "vertical" and "horizontal" will be used herein to refer to orthogonal directions between nearest neighbor color elements, whereas "diagonal" will be used herein to refer to the direction between next-nearest-neighbor color elements. While these terms may reflect the perspective of the referenced figures on the page and/or conventional reference to image sensor pixel arrays with respect to readout circuitry, it is understood that no preferred orientation is implied by such nomenclature; e.g., "row" and "column" designations are interchangeable, as are "horizontal" and "vertical" designations.

The term "substrate" is to be understood as a semiconductor-based material such as silicon, silicon-on-insulator (SOI) or silicon-on-sapphire (SOS) technology, doped and undoped semiconductors, epitaxial layers of silicon supported by a base semiconductor foundation, and other semiconductor structures. In addition, the semiconductor need not be silicon-based, but may be based on, for example, silicon-germanium, germanium, or gallium arsenide.

In addition, as understood by those skilled in the art, because each color filter element of a CFA in an image sensor is associated with (and may be considered part of) a respective pixel (or, in some implementations, associated with a respective group of pixels), the present disclosure sometimes refers to a CFA color filter element as a pixel (e.g., a "blue pixel of the CFA", or the like). Similarly, pixels of the image sensor pixel array are sometimes referred to by the color of their associated color filter element (e.g., "cross-talk into a blue pixel from a green pixel," or the like).

As noted above and as will be further understood in view of the ensuing disclosure, CFAs in accordance with some embodiments of the present invention are particularly well-suited for small-pixel image sensors, such as image sensors having subdiffraction-limit (SDL) pixels, where optical and carrier cross talk can be substantial. More specifically, digital image sensor outputs usually must be transformed to suit the human visual system, and this color correction amplifies noise, thus reducing the signal-to-noise ratio (SNR) of the image. In subdiffraction-limit (SDL) pixels, where optical and carrier cross talk can be substantial, this problem can become significant when conventional CFAs (CFAs) such as the Bayer patterns (RGB and CMY) are used. CFA patterns in accordance with some embodiments of the present invention are particularly well-suited for improving the color error and SNR deterioration caused by cross talk in such SDL pixels. It will be understood, however, that CFAs according to some embodiments of the present invention are not limited to image sensors having SDL pixels, but may implemented in image sensors where pixel size and/or pitch is greater than the Airy disk diameter of the diffraction-limited point response of the optical system.

Nonetheless, as recognized by the present inventors, as pixel sizes decrease to the SDL (e.g., submicron) range, most of the typically-considered restrictions on CFA design, such as the spatial resolution, become inconsequential. For such small (e.g., submicron) pixels, which are SDL pixels, as the pixel pitch may be less than the Airy disk diameter of the diffraction-limited point response of the optical system, a sampling rate less than the Nyquist rate can be used since the pixel size is much smaller than the smallest resolvable point. Particularly, the Airy disk diameter (D) for an optical system is dependent on its F-number (F) and the wavelength ($\lambda$) of the illumination: $D=2.44\lambda F$. For optical systems in most mobile applications with F-number of about 2.8, the smallest resolvable spot is 3.8 μm (assuming green light, 550 nm). Thus, for example, for submicron range pixels, such as in quanta image sensors (QISs) having pixels (e.g., jots) fractions of a micron or smaller, conventional restrictions on CFA design regarding spatial resolution and color moiré become trivial, allowing for various flexibilities in implementing various embodiments of novel CFA designs in accordance with some embodiments of the present disclosure.

Referring now to FIGS. 1 and 2, by way of background, illustrated are two conventional CFAs, namely, a Red-Green-Blue (RGB) Bayer CFA pattern (FIG. 1) and a complementary Cyan-Magenta-Yellow-Green (CMYG) CFA pattern (FIG. 2). Particularly, red, green, and blue color filter elements are referenced by R, G, and B, respectively, whereas cyan, magenta, and yellow, color filter elements are referenced by C, M, Y, respectively. Also, FIGS. 1 and 2 each include a thicker-lined square demarcating the kernel for the CFA.

As shown, the Bayer pattern (which is inarguably the most widely used CFA pattern for image sensors in digital cameras) has a red-green-green-blue 2×2 CFA kernel, configured such that its red and blue pixels are surrounded vertically and horizontally by green pixels. Cross-talk signal into red and blue pixels is therefore predominantly from green pixels. This extends the red and blue pixel responses into the green region of the spectrum. Likewise, green pixels receive cross-talk signal from two red and two blue pixels. This has the effect of reducing the actual signal for each of the red blue and green pixels while increasing the overlap in their spectral responses.

Since only a single color is sampled at each pixel, color interpolation is performed to create an estimate of each color at each pixel. For example, at a blue pixel of the Bayer pattern, green may be estimated as the average of the four neighboring green pixels. Thus interpolation on a kernel with n different colors will result n different signals for each pixel, each corresponding to a different color.

Further, in accordance with the hereinabove Background discussion, as will be understood by those skilled in the art, following interpolation it is commonly desired to convert the n signals into a red, green and blue signal using a color correction matrix (CCM). The CCM contains 3 rows and n columns. The n signals are arranged into a n×1 signal matrix so that when the CCM multiplies the signal matrix, three colors, red, green and blue (RGB), are the values of the 3×1 resulting matrix. The Bayer CFA pattern corresponds to a 3×3 CCM, and the CMYG CFA pattern results in a 3×4 CCM. Matrix values that are either much greater than unity, or less than zero, are sometimes needed to obtain good color reproduction. However, these values can result in noise amplification. Thus, there is often a tradeoff between color reproduction accuracy (or color error) and signal to noise ratio (SNR).

FIGS. 3 and 4 schematically depict two illustrative image sensor CFA patterns in accordance with some embodiments of the present invention. As in FIGS. 1 and 2, FIGS. 3 and 4 each include a thicker-lined square demarcating the kernel for the CFA. More specifically, in accordance with some illustrative embodiments, it is understood that the 5-by-5 array of color filter elements depicted in each of FIGS. 3 and 4 schematically represents only a portion of an image sensor CFA in which the CFA array kernel pattern repeats over the entire CFA. For clarity, it is noted that the term "kernel" (or similarly, "unit kernel"), as used herein, refers to a minimal repeating pattern of color filters or elements of a CFA that is two-dimensionally replicated over the full extent of the color filter array.

It will also be understood that an image sensor in accordance with some embodiments of the present disclosure comprises a CFA according to the CFA pattern depicted in any one of FIG. 3 and FIG. 4 disposed between a pixel array (not shown; e.g., beneath the depicted CFA) of the image sensor and light incident on the CFA. The pixel array and CFA may be configured such that a single pixel (and particularly its photosensor) underlies each respective single color filter element of the CFA. Alternatively, in some embodiments, the pixel array and CFA may be configured such that a group of two or more pixels (and particularly their photosensors) underlies each respective single color filter element of the CFA.

And more specifically, by way of non-limiting example, each of the illustrative CFA embodiments of FIGS. 3 and 4 is based on the regular Bayer CFA pattern, which is essentially enhanced to include a secondary color pixel between every two primary color pixels in the regular Bayer pattern in the vertical and horizontal directions, thus resulting in a kernel having an additional column and an additional row for each respective column and row in the kernel of the regular Bayer pattern.

In each illustrative embodiment of FIGS. 3 and 4, the secondary color introduced for each secondary color CFA element that is adjacent to two Bayer primary color CFA elements in the vertical (horizontal) direction is the color obtained by summing the two primary colors of those two adjacent Bayer primary color CFA elements. Accordingly, as shown in FIGS. 3 and 4, the CFAs are configured to include (i) a yellow pixel (Y) directly between (i.e., without intervening color filter elements) red (R) and green (G) pixels in the horizontal and vertical directions (e.g., such that the Y pixel is a nearest neighbor to the R and G pixels), and (ii) a cyan (C) pixel directly between blue (B) and green (G) pixels in the horizontal and vertical directions.

As can be seen, the illustrative embodiment of FIGS. 3 and 4 differ with respect to the color of the filter elements located at the intersection of the additional rows and additional columns (i.e., the rows and columns corresponding to the additional rows and columns in the enhanced Bayer pattern kernels of FIGS. 3 and 4, compared to conventional Bayer kernel of FIG. 1). For additional clarity and ease of reference, these filter elements that are located at the intersection of the additional rows and additional columns are referred to herein as being in the middle position 7, or similarly, as being the middle element 7 or middle pixel 7, depending on the context. As can also be seen, the middle elements 7 have only secondary color nearest neighbors (i.e., in this embodiment, the neighbors in the vertical and horizontal directions) and only primary color next-nearest neighbors (i.e., in this embodiment, the neighbors in the diagonal directions).

In the illustrative embodiment depicted in FIG. 3, the CFA is configured such that the middle elements 7 are green pixels. Configuring the middle elements—which are located along the additional rows and additional columns comprising the secondary color elements—as green (i.e., a primary color) is based on the fact that the middle position 7 has the same color nearest neighbors (i.e., two cyan elements and two yellow elements in the horizontal and vertical directions) as the primary green elements 9 that are in the rows and columns that include red (R) or blue (B) CFA elements, which are the rows and columns of the expanded Bayer pattern that correspond to the rows and columns of the regular Bayer pattern, but with interposed secondary color elements. For ease of reference, the latter green elements (or, similarly, green pixels) may be referred to herein as primary green elements (or primary green pixels) or primary sub-array green elements (or primary sub-array green elements), whereas the green pixels located in the middle positions 7 may be referred to herein as middle green elements (or middle green pixels), or as secondary-subarray green elements (or secondary-subarray green pixels), to distinguish these green elements from each other. Also for ease of reference, a CFA pattern according to the embodiment of FIG. 3 (i.e., having an R-Y-G-Y-Y-G-C-G-G-C-B-C-Y-G-C-G kernel) is referred to herein as RGBCY.

In accordance with some embodiments such as the illustrative embodiment of FIG. 4, each of the middle positions 7 may be configured as a white/panchromatic filter element (W) instead of a green filter element as in the embodiment of FIG. 3. For example, implementing a CFA design according to FIG. 4 may be advantageous for providing increased light sensitivity compared to CFA designs according to the embodiment of FIG. 3. It will be understood, however, that such increased sensitivity of the white/panchromatic filter elements may result in the corresponding pixels becoming saturated before any other pixels, which may hinder the sensor performance in bright light if no measures are taken. For ease of reference, a CFA pattern according to the embodiment of FIG. 4 (i.e., having an R-Y-G-Y-Y-W-C-W-G-C-B-C-Y-W-C-W kernel) is referred to herein as RGBCWY.

As will be understood by those skilled in the art in view of the present disclosure, in CFA patterns in accordance with embodiments such as those in FIG. 3 and FIG. 4, spectral overlap caused by cross talk is minimized since most of the cross talk is now in the same spectral region as the signal. More specifically, for example, crosstalk contributions from diagonal neighboring pixels are generally minimal compared to the crosstalk from lateral and vertical neighboring pixels. Accordingly, as individual primary color pixels of different colors in the embodiments of FIGS. 3 and 4 are disposed only diagonally (e.g., as next-nearest neighbors) from each other (i.e., not vertically or horizontally, as nearest neighbors), they have negligible cross-talk contributions with respect to each other. And as each primary color pixel is surrounded vertically and horizontally by secondary color pixels, crosstalk into primary color pixels comes from neighboring secondary color pixels and vice versa. This configuration thus ensures that there is some correlation between the crosstalk and the color signal since each set of two different primary color pixels separated by a secondary color pixel in the vertical and horizontal directions contributes to a secondary color which is a combination of those two primary colors. For example, instead of receiving crosstalk primarily from only Green pixels as in the conventional Bayer pattern, red pixels (R) corresponding to the enhanced Bayer pattern of the embodiments of FIGS. 3 and 4 receive crosstalk from Yellow pixels (Y), which increases the red signal while adding green. Similar cross-talk correlation effects result from the Blue pixels (B) of the FIG. 3 and FIG. 4 embodiments being surrounded in the vertical and horizontal directions by Cyan pixels (C), rather than by green pixels as in the conventional Bayer pattern. Accordingly, as a result of this spectral overlap reduction, the color correction process causes less noise amplification and SNR reduction when RGBCY and RGBCWY patterns in accordance with the embodiments of FIGS. 3 and 4 are used in image sensors (e.g., CMOS image sensors, which may be implemented as, for example, a QIS, DIS, or qDIS).

CFA patterns according to embodiments such as those in FIGS. 3 and 4 have five or six colors in their kernels compared to the three colors in the conventional Bayer pattern. Accordingly, assuming traditional interpolation methods are used, these CFA patterns result in 6×N or 5×N outputs requiring 3×6 and 3×5 color correction matrices, for the RGBCWY and RGBCY patterns, respectively. It is understood that these color correction matrices will increase computational costs compared to those required for a conventional Bayer CFA. It is also understood that the added color filters may increase fabrication costs, since, for example, additional masks may be required (e.g., two additional masks may be required for patterning the cyan (C) and yellow (Y) color filters for the RGBCY CFA pattern). Yet, for various image sensor designs where cross-talk would materially impact color reproduction accuracy and/or SNR, the benefits provided by CFA pattern designs according to embodiments of the present disclosure in mitigating such cross-talk effects may clearly outweigh such additional complexity and/or cost that may be incurred.

In addition, in accordance with some implementations, the five and six channel outputs may effectively be combined to produce robust R, G, B channels that can then use conventional tri-stimulus color correction requiring 3×3 matrices. For instance, for the five-channel RGBCY CFA, it is possible to combine channels to produce R', G', and B', where: R'=(R+Y−G)/2; G'=(G+Y−R+C−B)/3; B'=(B+C−G)/2. Likewise, for the six-channel RGBCWY CFA, it is possible to combine channels to produce R', G', B', where: R'=(R+Y−G+(W−B−G)+(W−C))/4 (and, for simplicity, similarly for G' and B', as will be understood by those skilled in the art).

Further, alternative implementations of some embodiments according to the present disclosure may use only three primary color filters (e.g., R, G, B filters, like the Bayer pattern) to form all color filter elements in the CFA (i.e., including the secondary color elements), thereby eliminating any additional costs and/or fabrication complexities associated with additional mask levels.

By way of example, FIG. 5 depicts an illustrative alternative implementation of the RGBCY pattern of FIG. 3, referred to herein as sRGBCY, wherein the filter for each secondary color pixel (i.e., the Y and C pixels) is implemented with two half-portions of primary filters whose colors sum up to give the secondary color. Thus, as shown in FIG. 5, the active region (e.g., photoconversion area) of each yellow pixel is half-covered by a red filter and half-covered by a green filter. The red half of the yellow pixel is the half closest to the nearest-neighbor red pixel, and the green half is closest to the nearest-neighbor green pixel. In a similar fashion, the cyan pixels are half-covered by blue filters and half-covered by green. A thicker-lined square demarcates the kernel of the sRGBCY pattern (which corresponds to the kernel of the RGBCY pattern of FIG. 3, but with the described substitution of two half-portion primary filters for each secondary color filter).

FIG. 6 depicts an embodiment corresponding to the CFA of FIG. 5 transformed such that adjacent color filter elements having the same color (though corresponding to different pixels) are implemented as a continuous color filter region. Again, the kernel (which corresponds to the kernel of FIG. 5) is demarcated by a thicker-lined square. The resulting pattern of the CFA, as would be seen viewing an extended area of the array, is a sea of green with alternating rows and columns of red and blue cross patterns. Depending on the shape of the photosensitive region of each pixel, the exact pattern may be slightly different than the pattern shown in FIG. 6. Splitting secondary color filters into the two primary filters may result in a "crack" over the photosensitive region where white light could leak through and be absorbed. Allowing a small overlap in the color filters may ensure the removal of any such "crack". Alternatively, this light leakage could be blocked by means of a narrow strip of metal wire. If consistent across pixels, the effects of this leakage could be removed during color correction.

Figure 7:
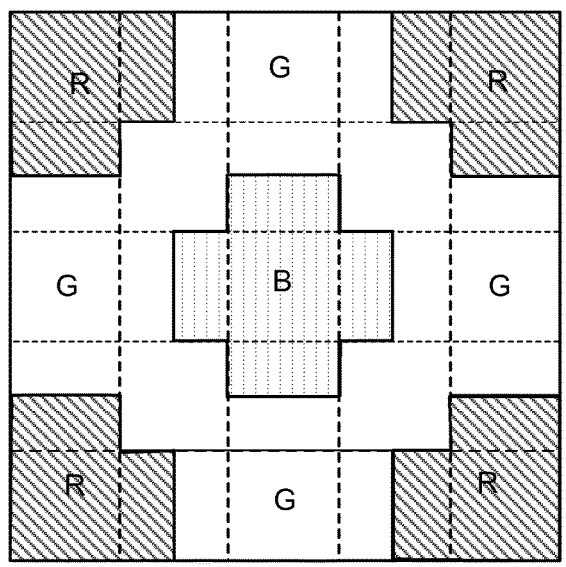
FIG. 7 depicts the color filter array of FIG. 6, with dashed lines added (and the kernel demarcation removed) to illustrate the underlying image sensor pixel regions and their alignment relative to the color filter array, in accordance with some embodiments of the present invention.

For additional clarity, FIG. 7 depicts the CFA of FIG. 6, with dashed lines added (and the kernel demarcation removed) to illustrate the underlying image sensor pixel regions and their alignment relative to the CFA. As can be seen, some secondary pixels (i.e., yellow pixels) are half-covered by a red filter and half-covered by a green filter, whereas other secondary pixels (i.e., cyan pixels) are half-covered by a blue filter and half-covered by a green filter, and middle pixels are covered by a green filter.

It is important to note that using two half-primary color filters in place of the secondary color filters will reduce their light transmission by half. As such, the sRGBCY has the same sensitivity as the Bayer pattern. It is further noted that in some alternative implementations of sRGBCY CFAs, the two primary color filters composing the filter elements of secondary color pixels may have unequal areas (i.e., rather than each covering half of the photosensitive area, as implemented in the FIG. 5 and FIG. 6 embodiments).

Figure 8:
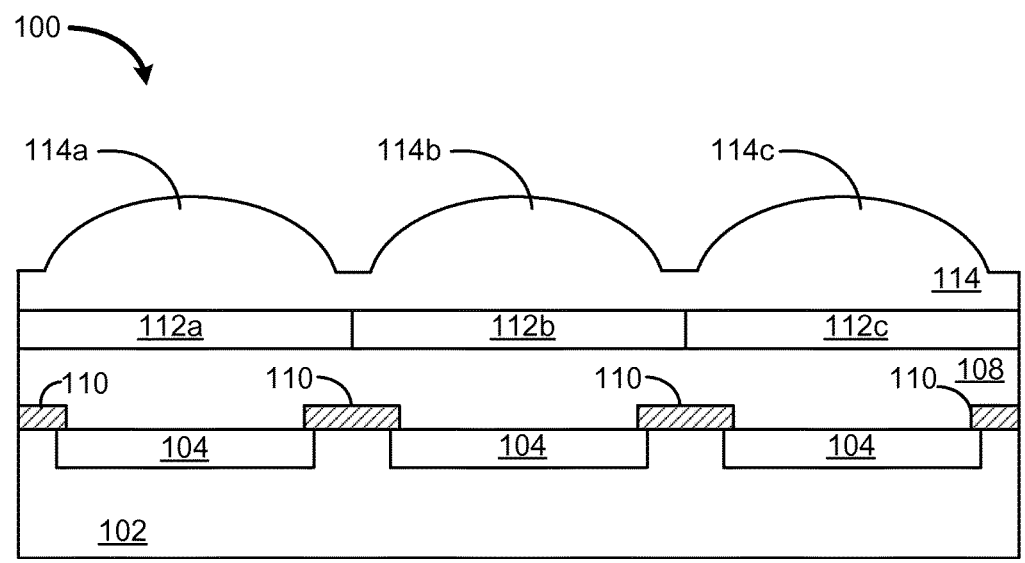
FIG. 8 depicts an illustrative cross-sectional view of a portion of an image sensor, in accordance with some embodiments of the present invention.

FIG. 8 schematically depicts a cross sectional view of a portion of an illustrative image sensor 100 (e.g., a CMOS image sensor) that may be implemented in accordance with some illustrative embodiments of the present disclosure, such as the CFA embodiments of FIGS. 3 and 4. More specifically, FIG. 8 depicts a portion of the pixel array portion of image sensor 100, which may further include additional circuitry (not shown) outside the pixel array, such as row and column timing and driver circuitry, column sense amplifiers, and A/D converters, monolithically integrated (i.e., on the same chip) as part of image sensor 100. And further, for purposes of clarity of exposition, FIG. 8 illustrates a cross-sectional portion of only three neighboring pixels of the pixel array portion of image sensor 100, the illustrative cross section being along a vertical or horizontal direction of the CFA array (and corresponding pixel array) and intersecting the photosensitive regions of the pixels.

As shown, the pixels are formed on a substrate (e.g., silicon) 102, each pixel including a photosensor (e.g., photodiode) 104. Also shown, by way of example, are light shielding elements 110 that may be included to prevent or reduce optical cross-talk. A dielectric layer 108 (e.g., which may comprise one or more layers) is formed over the photosensors 104 and light shielding elements 110. Routing structures such as conductive interconnect routing structures (not shown) may be formed in dielectric layer 108. A color filter array comprising filter elements 112a, 112b, 112c arranged in a CFA pattern (such as the CFA patterns of FIGS. 3 and 4) is formed on dielectric layer 108, and a dielectric layer 114 (e.g., which may comprise one or more layers) is formed into an array of microlenses, including microlens elements 114a, 114b, 114c.

Each microlens 112a, 112b, 112c directs incident light through an associated color filter element 112a, 112b, 112c, towards an associated photosensor 104, which absorbs the incident light focused by the microlens and produces image signals that correspond to the amount of incident light absorbed. By way of example, filter 112a, 112b, and 112c may be red (R), yellow (Y), and green (G) filter elements, respectively, or similarly, may be red (R), cyan (C), and blue (B) filter elements, respectively, in accordance with the CFA embodiments FIGS. 3 and 4. And in some implementations in accordance with the sRGBCY embodiments discussed above, filter element 112b may be implemented as a red filter half and a green filter half (to provide a yellow pixel) or as a blue filter half and a green filter half (to provide a cyan pixel portion).

It will be understood that the cross-sectional structure of FIG. 8 is merely illustrative, and is also simplified for clarity of exposition. For example, as known to those skilled in the art, each pixel includes associated pixel circuitry, which may be configured in various ways (e.g., 4T pixel, shared-readout circuitry, etc.) and may include, for example, a reset transistor, a transfer gate, a floating diffusion, an amplifier (e.g., source-follower transistor), and a readout transistor.

Additionally, for example, while FIG. 8 depicts a frontside illumination (FSI) configuration, it will be understood in view of the foregoing that CFA embodiments in accordance with the present disclosure are not limited to frontside illumination; frontside or backside illumination (BSI) may be implemented in various embodiments. That is, for example, in some embodiments the color filters (and associated microlenses and/or other microoptics) may be implemented on the backside (i.e., on the surface opposite the surface on which the pixel array is formed).

As also indicated above, it will also be understood that in various embodiments, each filter element of the CFA may be associated with two or more underlying individual photosensors (instead of being associated with a respective photosensor of an associated pixel, as in the illustrative embodiments of FIGS. 3-8).

In addition, it will be understood in view of the foregoing that CFA implementations according to the present disclosure may also be implemented in image sensors comprising stacked structures, wherein the photodetector is above the readout electronics to improve quantum efficiency of the photodetector and increase chip area available for readout electronics.

While color filter elements (photon wavelength/energy filters) may be implemented using pigment or dye based materials, various image sensor implementations embodying a CFA according to the present disclosure the color filter elements may comprise other selectively absorptive materials, interference filters, gratings, and metallic clusters or quantum dots. Colors can include standard RGB and complementary colors, as well as invisible colors such as NIR, and UV.

In addition, CFAs that include secondary color filter elements to mitigate the effects of crosstalk in accordance with the present disclosure are limited to neither square pixel array structures nor enhanced Bayer patterns, but may be implemented using other pixel/color filter element shapes and array configurations (e.g., rectangular, octagonal, etc.) and/or other CFA patterns.

As also indicated above, a CFA according to some embodiments of the present disclosure may be implemented in myriad types of image sensors, such as a conventional CMOS image sensor (e.g., configured to operate in charge integration mode, with a single integration period per pixel per frame), a charge-coupled device (CCD) image sensor, a digital integration sensor (DIS), a quantized DIS (qDIS), a Quanta Image Sensor (QIS), or other image sensors. In some embodiments, the pixels may be sub-diffraction limit pixels, which in some implementations may be jots. By way of further example, in some implementations the image sensor pixel size is less than or equal to half the Airy disk diameter for the imaging system optics diffraction limit, and in some implementations the pixel size is less than 1 um.

In other words, in view of the present disclosure one skilled in the art will understand that CFAs in accordance with the present disclosure are applicable to myriad image sensors and image sensor pixel configurations, and are not limited to or by the image sensor and pixel circuit configurations generally described herein for purposes of ease of reference and clarity of exposition.

It is further noted that the present inventors have conducted simulations of RGBCWY, RGBCY, and sRGBCY CFA patterns corresponding to embodiments disclosed herein, together with simulations of conventional Bayer and CMY CFA patterns corresponding to FIGS. 1 and 2 herein. Results and analysis of such simulations are described in, J. Opt. Soc. Am. A/Vol. 32, No. 1, January 2015, *Color filter array patterns for small-pixel image sensors with substantial cross talk*, L. Anzagira and E. R. Fossum, which is hereby incorporated herein by reference. Briefly, as detailed in this reference, CFA patterns according to the embodiments disclosed herein demonstrated significantly better performance (e.g., with respect to color reproduction accuracy and SNR), and less degradation, under high cross-talk conditions compared to the conventional Bayer and CYM patterns. For example, compared to low cross-talk conditions, these novel CFA patterns show only slight deterioration in color reproduction accuracy (e.g., <10%) in the presence of high crosstalk, whereas the conventional Bayer and CMY patterns showed a significant increase in color error (and high color errors) in the presence of high crosstalk. Also, relative to low crosstalk conditions, the Bayer RGB and CMY patterns have notably high reduction in the color gamut as a result of high crosstalk, whereas the novel CFA patterns had significantly lower reduction in their color gamut under high crosstalk. As such, compared to the Bayer RGB and CMY patterns, the novel CFA patterns will require less extensive color correction to restore the color gamut.

Some aspects of the present invention have been illustrated and described with respect to specific embodiments thereof, which embodiments are merely illustrative of the principles of the invention and are not intended to be exclusive or otherwise limiting embodiments. Accordingly, although the above description of illustrative embodiments of the present invention, as well as various illustrative modifications and features thereof, provides many specificities, these enabling details should not be construed as limiting the scope of the invention, and it will be readily understood by those persons skilled in the art that the present invention is susceptible to many modifications, adaptations, variations, omissions, additions, and equivalent implementations without departing from this scope and without diminishing its attendant advantages. For instance, except to the extent necessary or inherent in the processes themselves, no particular order to steps or stages of methods or processes described in this disclosure, including the figures, is implied. In many cases the order of process steps may be varied, and various illustrative steps may be combined, altered, or omitted, without changing the purpose, effect or import of the methods described. It is further noted that the terms and expressions have been used as terms of description and not terms of limitation. There is no intention to use the terms or expressions to exclude any equivalents of features shown and described or portions thereof. Additionally, the present invention may be practiced without necessarily providing one or more of the advantages described herein or otherwise understood in view of the disclosure and/or that may be realized in some embodiments thereof. It is therefore intended that the present invention is not limited to the disclosed embodiments but should be defined in accordance with the claims that follow.

What is claimed is:

1. A color filter array for an image sensor that comprises a plurality of pixels, the color filter array comprising:
    a plurality of kernels, wherein each kernel has an identical configuration of color filter elements comprising (i) primary color filter elements corresponding to at least three respective different primary colors, each of the primary color filter elements configured to selectively transmit photons corresponding to the primary color to which the primary color filter element corresponds, and (ii) a plurality of secondary color filter elements;
    wherein a respective one of the secondary color filter elements is disposed as a nearest neighbor to and between every pair of primary color filter elements of different colors in the kernel, with the respective secondary color filter element representing a secondary color that is a combination of the different colors of the primary color filter elements that are nearest neighbors to the respective secondary color filter element; and
    wherein each of the secondary color filter elements is configured as two color filter portions having respective primary color filter characteristics of the nearest neighbor primary color filter elements.

2. The color filter array according to claim 1, wherein each of the secondary color filter elements is configured as a continuous material having color filter characteristics of the secondary color.

3. The color filter array according to claim 1, wherein the two color filter portions have equal areas with respect to filtering light that passes therethrough for incidence on an associated one of the pixels of the image sensor.

4. A color filter array for an image sensor that comprises a plurality of pixels, the color filter array comprising:
    a plurality of kernels, wherein each kernel has an identical configuration of color filter elements comprising (i) primary color filter elements corresponding to at least three respective different primary colors, each of the primary color filter elements configured to selectively transmit photons corresponding to the primary color to which the primary color filter element corresponds, and (ii) a plurality of secondary color filter elements;
    wherein a respective one of the secondary color filter elements is disposed as a nearest neighbor to and between every pair of primary color filter elements of different colors in the kernel, with the respective secondary color filter element representing a secondary color that is a combination of the different colors of the primary color filter elements that are nearest neighbors to the respective secondary color filter element; and
    wherein each kernel further comprises at least one third color filter element, each of the at least one third color filter element disposed as a nearest neighbor only to the secondary color filter elements and not as a nearest neighbor to any of the primary filter elements.

5. The color filter array according to claim 4, wherein each of the at least one third color filter elements has a color filter characteristic of one of the primary color filters.

6. The color filter array according to claim 4, wherein each of the at least one third color filter elements has a color filter characteristic corresponding to a summation of the colors of each primary color filter element that is a next-nearest neighbor to the at least one third color filter element.

7. The color filter array according to claim 1, wherein the kernel is configured as a regular rectangular array, with the color filter elements of the kernel arranged in a row/column configuration.

8. A color filter array for an image sensor that comprises a plurality of pixels, the color filter array comprising:
   a plurality of kernels, wherein each kernel has an identical configuration of color filter elements comprising (i) primary color filter elements corresponding to at least three respective different primary colors, each of the primary color filter elements configured to selectively transmit photons corresponding to the primary color to which the primary color filter element corresponds, and (ii) a plurality of secondary color filter elements;
   wherein a respective one of the secondary color filter elements is disposed as a nearest neighbor to and between every pair of primary color filter elements of different colors in the kernel, with the respective secondary color filter element representing a secondary color that is a combination of the different colors of the primary color filter elements that are nearest neighbors to the respective secondary color filter element; and
   wherein the kernel comprises a 4×4 array, wherein the primary color filter elements have blue, red, and green color filter characteristics, and the kernel is configured row-by-row as R-Y-G-Y-Y-X-C-X-G-C-B-C-Y-X-C-X, wherein R, G, B, Y, and C represent color filter elements having red, green, blue, yellow, and cyan color filter characteristics, respectively, and wherein X represents color filter elements having an arbitrary color filter characteristic.

9. The color filter array according to claim 8, wherein X represents color filter elements having a green (G) color filter characteristic.

10. The color filter array according to claim 8, wherein X represents color filter elements having a white (W) color filter characteristic.

11. The color filter array according to claim 8, wherein each of the yellow (Y) color filter elements is configured as a red color filter portion and a green color filter portion, and wherein each of the cyan (C) color filter elements is configured as a blue color filter portion and a green color filter portion.

12. An image sensor comprising the plurality of pixels and the color filter array according to claim 1, wherein the color filter array is formed over the plurality of pixels.

13. The image sensor according to claim 12, wherein each of the color filter elements overlies a respective individual pixel of the image sensor.

14. The image sensor according to claim 12, wherein each of the color filter elements overlies a plurality of individual photosensors of the image sensor.

15. The image sensor according to claim 12, wherein each of the pixels is a sub-diffraction limit pixel.

16. The image sensor according to claim 15, wherein each of the pixels has a size less than or equal to half the Airy disk diameter for the imaging system optics diffraction limit associated with the image sensor.

17. The image sensor according to claim 12, wherein each of the pixels has a size less than 1 micron.

18. The image sensor according to claim 12, wherein the image sensor is a CMOS image sensor.

19. The image sensor according to claim 12, wherein the image sensor is a quanta image sensor (QIS), a digital integration sensor (DIS), or a quantized digital integration sensor (qDIS).

* * * * *